(12) United States Patent
Okafuji et al.

(10) Patent No.: US 11,904,521 B2
(45) Date of Patent: Feb. 20, 2024

(54) RECTANGULAR SUBSTRATE FOR IMPRINT LITHOGRAPHY AND MAKING METHOD

(71) Applicant: Shin-Etsu Chemical Co., Ltd., Tokyo (JP)

(72) Inventors: Daiyu Okafuji, Joetsu (JP); Hiroyuki Yamazaki, Joetsu (JP); Masao Ando, Joetsu (JP); Masaki Takeuchi, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 423 days.

(21) Appl. No.: 15/715,442

(22) Filed: Sep. 26, 2017

(65) Prior Publication Data

US 2018/0079130 A1 Mar. 22, 2018

Related U.S. Application Data

(62) Division of application No. 14/828,573, filed on Aug. 18, 2015, now Pat. No. 9,884,448.

(30) Foreign Application Priority Data

Aug. 19, 2014 (JP) ................................. 2014-166352

(51) Int. Cl.
*B29C 59/02* (2006.01)
*B24B 9/06* (2006.01)
(Continued)

(52) U.S. Cl.
CPC ............ *B29C 59/026* (2013.01); *B24B 9/065* (2013.01); *B29C 33/3842* (2013.01); *G03F 7/0002* (2013.01); *B29K 2909/08* (2013.01)

(58) Field of Classification Search
CPC ............ B29C 2059/027; B29C 59/026; B29C 33/3842; B24B 9/065; G03F 7/0002; B29K 2909/08
See application file for complete search history.

(56) References Cited

U.S. PATENT DOCUMENTS 8,543,352 B2   9/2013 Aritsuka et al.
9,205,528 B2  12/2015 Okafuji et al.
(Continued)

FOREIGN PATENT DOCUMENTS

EP    1 800 797 A1    6/2007
EP    2 399 707 A2   12/2011
(Continued)

OTHER PUBLICATIONS

Extended European Search Report (EESR) dated Jul. 8, 2016, issued in counterpart European Application No. 15181619.6. (8 pages).

(Continued)

*Primary Examiner* — Ryan M Ochylski
(74) *Attorney, Agent, or Firm* — WHDA, LLP

(57) ABSTRACT

A rectangular substrate is prepared by providing a starting rectangular substrate having front and back surfaces and four side surfaces as ground, and pressing a rotary polishing pad perpendicularly against one side surface under a constant pressure, and relatively moving the rotary polishing pad and the substrate parallel to the side surface, for thereby polishing the side surface of the substrate. In the imprint lithography, the rectangular substrate is capable of controlling compression and pattern shape at a high accuracy and thus transferring a complex pattern of fine feature size to a recipient.

5 Claims, 8 Drawing Sheets

(51) Int. Cl.
  *B29C 33/38* (2006.01)
  *G03F 7/00* (2006.01)

(56) References Cited

U.S. PATENT DOCUMENTS

| | | | |
|---|---|---|---|
| 9,902,037 | B2 | 2/2018 | Okafuji et al. |
| 2008/0261119 | A1* | 10/2008 | Ueda ............... G03F 7/70791 430/5 |
| 2011/0244171 | A1* | 10/2011 | Okamura ............... G03F 1/24 428/81 |
| 2011/0318996 | A1 | 12/2011 | Okafuji et al. |
| 2013/0011773 | A1 | 1/2013 | Nakanishi et al. |
| 2013/0062754 | A1 | 3/2013 | Fujii |
| 2013/0101790 | A1* | 4/2013 | Okafuji ............... G03F 1/60 428/141 |
| 2013/0149494 | A1 | 6/2013 | Koike et al. |
| 2014/0120198 | A1 | 5/2014 | Harada et al. |
| 2015/0097304 | A1 | 4/2015 | Koike et al. |
| 2015/0248910 | A1* | 9/2015 | Itaya ............... G11B 5/73 428/836 |

FOREIGN PATENT DOCUMENTS

| | | |
|---|---|---|
| JP | 3-54569 A | 3/1991 |
| JP | 2005 316448 A | 11/2005 |
| JP | 2005-533393 A | 11/2005 |
| JP | 2006062055 A | 3/2006 |
| JP | 2009-536591 A | 10/2009 |
| JP | 4384954 B2 | 12/2009 |
| JP | 2010 282007 A | 12/2010 |
| JP | 2012-027176 A | 2/2012 |
| JP | 2013-88793 A | 5/2013 |
| WO | 03/025992 A1 | 3/2003 |
| WO | 2007/132320 A2 | 11/2007 |
| WO | 2008/142916 A1 | 11/2008 |
| WO | 2012/008343 A1 | 1/2012 |
| WO | WO-2014051153 A1 * | 4/2014 ............... G11B 5/73 |

OTHER PUBLICATIONS

Office Action dated May 22, 2018, issued in counterpart Japanese application No. 2015-150738, with English translation. (11 pages).

* cited by examiner

RECTANGULAR SUBSTRATE FOR IMPRINT LITHOGRAPHY AND MAKING METHOD

CROSS-REFERENCE TO RELATED APPLICATION

This application is a divisional of U.S. application Ser. No. 14/828,573 filed on Aug. 18, 2015, which is based upon and claims the benefit of priority of the prior 35 U.S.C. § 119(a) on Patent Application No. 2014-166352 filed in Japan on Aug. 19, 2014, the entire contents of which are hereby incorporated by reference.

TECHNICAL FIELD

This invention relates to a rectangular substrate which is suited for use in the imprint lithography, especially nanoimprint lithography (NIL) and serves as a template for forming a topographic pattern on a surface in the process of fabricating electronic devices, optical components, storage components, bioelectronic components and the like, and a method for preparing the rectangular substrate.

BACKGROUND ART

In the fabrication of electronic devices, optical components, storage components, bioelectronic components and the like, not only higher performance and further miniaturization are demanded, but also a reduction of the manufacture cost is required at the same time. Under the circumstances, the imprint lithography is highlighted since it can reduce the cost of micropatterning as compared with the conventional lithography processes. In the imprint lithography, a (topographic) pattern of protrusions and recessions is formed by mechanical means. Specifically a mold-forming substrate having a desired topographic pattern on the surface is pressed to a resin layer of given thickness on a recipient substrate for thereby transferring the topographic pattern on the mold to the resin layer. See Patent Document 1. Substrates used in the imprint lithography have different outer shapes including rectangular shape of 65 mm squares or 152 mm squares, and circular shape having a diameter of 50 mm, 100 mm, 150 mm or 200 mm, with a choice being made in accordance with the intended application.

In the imprint lithography, the resin layer to which the topographic pattern has been transferred by pressing is cured whereby the shape of the resin layer is retained. The cure may be implemented typically by UV cure and heat cure modes. In either mode, it is important to press the mold-forming substrate and the resin layer-bearing recipient substrate together while maintaining parallelism between them and providing a uniform pressure within the contact plane. The mold-forming substrate to be provided with a topographic pattern is required to have a high shape accuracy. See Patent Document 2.

In recent years, the photo (UV) nanoimprint lithography encounters an increasing demand to provide a mold-forming substrate with a finer size pattern or more complex pattern for transfer. In such high-definition imprint lithography, very precise positioning at high accuracy, control of compression pressure, and control of pattern shape are required. Under the circumstances, in the imprint lithography using rectangular substrates, the rectangular substrates themselves must have a high shape accuracy.

For example, Patent Document 3 discloses an actuation system comprising a plurality of actuators disposed so as to enclose a rectangular substrate, wherein the end surfaces of the substrate are compressed by a plurality of forces, for thereby bowing or deforming the compressed portion of the substrate, for thereby accomplishing compression and pattern shape control at a high accuracy.

CITATION LIST

Patent Document 1: JP-A 2005-533393 (WO 2003/025992)
Patent Document 2: JP-A H03-54569
Patent Document 3: JP-A 2009-536591 (WO 2007/132320)

DISCLOSURE OF INVENTION

Under the circumstances, the rectangular substrates used in imprint lithography are required to have a high shape accuracy, and especially the side surfaces of the substrate compressed by the actuator system are required to have a high flatness and orthogonality therebetween. Unless the side surfaces are fully flat or unless the side surfaces are orthogonal, problems arise when the actuator system is operated to compress the side surfaces. Namely, the force is not conveyed under the predetermined pressure, or the side surfaces can be distorted beyond expectation, failing to control bowing and deformation at a high accuracy.

An object of the invention is to provide a rectangular substrate for use in imprint lithography and capable of controlling compression and pattern shape at a high accuracy.

The inventors have found that the above problems of imprint lithography are overcome using a rectangular substrate having side surfaces with an improved flatness.

In one aspect, the invention provides a method for preparing a rectangular substrate for use in imprint lithography, comprising the steps of:

providing a starting rectangular substrate having front and back surfaces and four side surfaces as ground, and pressing a rotary polishing pad perpendicularly against one side surface of the substrate under a constant pressure, and relatively moving the rotary polishing pad and the substrate parallel to the side surface, for thereby polishing the side surface of the substrate.

In a preferred embodiment, the moving speed of the relative parallel movement of the rotary polishing pad and the substrate is changed in accordance with a position on the substrate side surface being polished.

The side surface of the substrate includes a longitudinal central region and longitudinal edge regions. In a preferred embodiment, the moving speed of the relative parallel movement of the rotary polishing pad and the substrate is faster when the center of the rotary polishing pad is positioned at the longitudinal edge region of the substrate side surface than when the center of the rotary polishing pad is positioned at the longitudinal central region of the substrate side surface.

In a preferred embodiment, the moving speed of the relative parallel movement is changed in accordance with protrusions and recessions on the substrate side surface.

In a preferred embodiment, the moving speed is faster at protrusions than at recessions on the substrate side surface.

The method may further comprise the step of relatively moving the rotary polishing pad and the substrate in a transverse or width direction of the substrate side surface, for thereby polishing the side surface.

In a preferred embodiment, after one side surface of the substrate has been polished, the substrate is turned 90°, a next side surface is polished, and these steps are repeated until all four side surfaces of the substrate are polished.

The method may further comprise the step of grinding the back surface of the substrate to form a recess or channel, before or after the step of grinding the side surfaces, or after the step of polishing the ground side surfaces.

In a preferred embodiment, the ground recess or channel has a side wall and a bottom wall, the method further comprising the step of polishing the side and bottom walls of the recess or channel as ground.

In a preferred embodiment, the step of polishing the side and bottom walls of the recess or channel as ground includes keeping a working portion of a rotary polishing tool in contact with the side and bottom walls under independent constant pressures.

In another aspect, the invention provides a rectangular substrate for use in imprint lithography, the substrate having front and back surfaces and four side surfaces, the front surface being engraved with a pattern of protrusions and recessions, and the side surfaces having a flatness of up to 20 μm.

In a preferred embodiment, the angle included between adjoining side surfaces is in a range of 90±0.1°.

In a preferred embodiment, the side surfaces are mirror finished. Typically, the side surfaces have a surface roughness Ra of 0.01 to 2 nm.

In a preferred embodiment, the back surface is provided with a Recess or Channel.

Advantageous Effects of Invention

In the imprint lithography, the rectangular substrate is capable of controlling compression and pattern shape at a high accuracy and thus transferring a complex pattern of fine feature size to a recipient.

BRIEF DESCRIPTION OF DRAWINGS

FIGS. 5A-5D illustrate a rectangular substrate having a machined back surface in a yet further embodiment of the invention, FIG. 5A being a plan view of the substrate having a channel in the back surface of the substrate of FIG. 1, FIG. 5B being a plan view of the substrate having a channel in the back surface of the substrate of FIG. 2, FIGS. 5C and D being cross-sectional views of FIGS. 5A and.

DESCRIPTION OF EMBODIMENTS

Figure 1A:
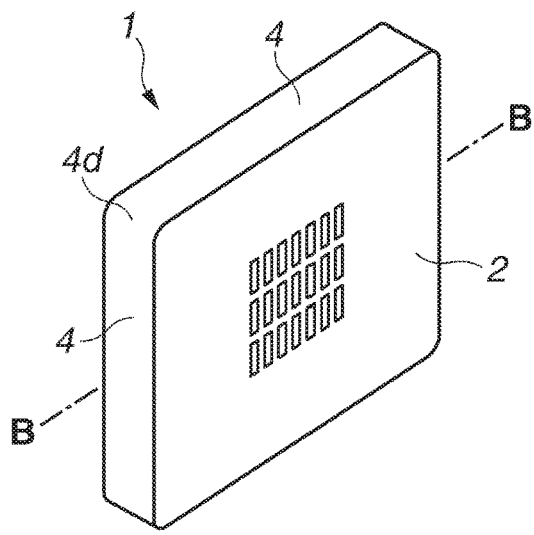
FIGS. 1A-1D illustrate a rectangular substrate in one embodiment of the invention, FIG. 1A being a perspective view, FIG. 1B being a cross-sectional view taken along lines B-B in FIG. 1A, FIG. 1C being a partially cutaway, perspective, enlarged view of one corner of the substrate, and FIG. 1D being a partially cutaway, perspective, enlarged view of one side surface of the substrate.
Figure 1B:
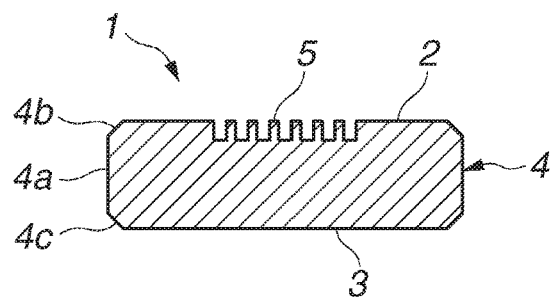
Figure 1C:
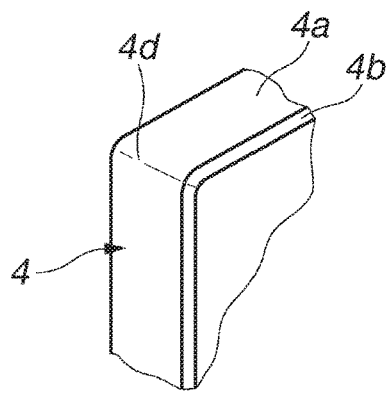
Figure 1D:
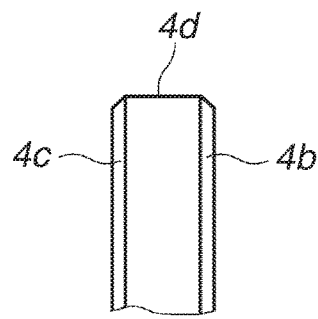

In the following description, like reference characters designate like or corresponding parts throughout the several views shown in the figures. The singular forms "a", "an" and "the" include plural referents unless the context clearly dictates otherwise. It is also understood that terms such as "front," "back," and the like are words of convenience and are not to be construed as limiting terms.

Referring to FIGS. 1A-1D and 2A-2B, exemplary rectangular substrates for imprint lithography according to embodiments of the invention are illustrated. The substrate 1 is a rectangular plate substrate having two opposed surfaces 2 and 3 and four side surfaces 4. One of the opposed surfaces is referred to as front surface 2 and the other as back surface 3. The front surface 2 is engraved with a topographic pattern 5 consisting of protrusions and recessions (FIGS. 1A-1D) or a mesa structure 6 (FIGS. 2A-2B), which is useful in the imprint lithography. Typically, four corners of the rectangular substrate are curvilinearly worked. The substrate includes curvilinear corners 4d each connecting adjoining side surfaces 4a smoothly. Also, the boundary defined by the front or back surface 2 or 3 and the side surface 4a and curvilinear corner 4d is chamfered at 4b or 4c.

The side surfaces of the rectangular substrate for imprint lithography according to the invention should have a flatness of up to 20 microns (μm), preferably up to 10 μm, and more preferably up to 5 μm. The flatness of a substrate side surface is defined, provided that the least square plane calculated from the substrate side surface is a reference plane, as the sum of a maximum distance between the reference plane and convex portions on the side surface and a maximum distance between the reference plane and concave portions on the side surface. A smaller value indicates a higher flatness. Measurement of flatness may be conducted, for example, by the optical interference method of directing coherent light, typically laser light to a substrate surface where it is reflected so that a difference in height of the substrate surface is observed as a phase shift of reflected light. For example, an interferometer Zygo Mark IVxp or Zygo NewView 7300 by Zygo Corporation may be used for measurement.

The flatness of a substrate side surface refers to the flatness of substrate side surface 4a in FIGS. 1A-1D while curvilinear corner 4d and chamfers 4b, 4c are excluded from the region of flatness measurement. When the region of flatness measurement is strictly defined, it is preferably a region ensuring substantial precision measurement, that is, a rectangular region of side surface 4a left after a band of a predetermined distance from each periphery is removed. If the flatness of a substrate side surface is measured by the optical interference method, for example, in a region in proximity to the periphery which is close to corner 4d or chamfer 4b, 4c, scattering light may interfere with accurate measurement of flatness. Although it cannot be definitely described how to set the predetermined distance of the band to be removed partly because the distance depends on the overall size of the substrate, the region of flatness measurement is typically a rectangular region in side surface 4a which is left by subtracting a band with a distance of 2%, preferably 5%, more preferably 10% of the longitudinal distance from the longitudinally opposed edges of side surface 4a and subtracting a band with a distance of 5%, preferably 15%, more preferably 20% of the transverse distance from the transversely opposed edges of side surface 4a.

If a rectangular substrate having side surfaces whose flatness is more than 20 μm is used in the imprint lithography to transfer a pattern of protrusions and recessions on the substrate to a resin layer, many problems arise as described below. For example, an imprint lithography system includes an actuator system which includes a plurality of actuators for compressing the side surface of a rectangular substrate. In some cases, one or more actuators fail to compress the side surface under a predetermined pressure, or a compressed portion of the substrate is given distortion beyond expectation. Then bending or deformation of the compressed portion of the substrate cannot be controlled at a high accuracy. As a result, when resin droplets on a recipient substrate are compressed, it is not possible to expel the gas present between the resin droplets in an efficient controlled manner, and the gas left in the resin causes defects in the transferred pattern on the resin. Also, corrections of various parameters (magnification, skew/orthogonality, trapezoidal properties) of the pattern topography by deforming the compressed portion of the substrate in a high accuracy control manner are not successful, failing to obtain a pattern of desired topography. If a rectangular substrate having side surfaces with a low flatness is held by clamping the side surfaces under pressure, the substrate is clamped in an inclined manner, and the pattern formed on the resin is shifted from the desired position.

Also the angle included between adjoining side surfaces is preferably within 90°±0.1°, more preferably within 90°±0.05°, from the consideration that when the side surfaces of a rectangular substrate are clamped by the actuator system, the substrate is prevented from rotation, inclination or undesired motion, and is accurately registered with the desired position on the recipient substrate. The angle included between adjoining side surfaces is strictly the angle included between the least square planes derived from the side surfaces. The angle included between adjoining side surfaces may be measured, for example, according to SEMI P1-92, the method for measuring rectangularity, by bringing a dial gauge in contact with an arbitrary point on a side surface which should be orthogonal to a reference side surface, and computing an angle from the reading of the dial gauge and the distance between measurement points.

It is preferred from the aspects of cleanness and strength that the side surfaces of a rectangular substrate be mirror-like. Specifically, the side surfaces should preferably have a surface roughness (Ra) of up to 2 nm, more preferably up to 0.5 nm. The surface roughness (Ra) may be measured according to JIS B0601.

The rectangular substrate preferably has an outer shape of 20 to 300 mm squares, more preferably of 50 to 200 mm squares for ease of handling. Also preferably the substrate has a thickness of 1 to 10 mm, more preferably 3 to 8 mm. A substrate which is thinner than 1 mm is liable to deform under the influence of holding means or sag by own weight, leading to misalignment and errors of the transferred pattern. A substrate which is thicker than 10 mm is difficult to transport or handle and costly due to a larger volume and higher weight.

The curvilinear corners of a rectangular substrate should preferably have a radius of curvature (R) of 0.5 to 10, more preferably 1.5 to 3.5, in order to impart strength to the corner to prevent chipping, fissure and cracking and to prevent wash liquid from accumulating or remaining during substrate washing and drying.

The rectangular substrate may be made of quartz glass, titania-doped quartz glass, silicon (Si), silicon oxide film, polydimethylsiloxane (PDMS), nickel (Ni), sapphire, and hybrid materials thereof. Of these, quartz glass substrates are often utilized in the imprint lithography using UV radiation for resin layer curing, because quartz glass is UV transmissive. Quartz glass substrates are also transparent in the visible light region, and thus have the advantage of easy positioning upon transfer.

On the front surface of the rectangular substrate, a metal thin film or resist film may be deposited for engraving a pattern of protrusions and recessions. In a preferred procedure, a metal thin film or resist film is previously coated before a pattern is formed on a mold-forming substrate using an EB imaging tool. By the standard technique, the metal thin film or resist film may be formed to a thickness of 5 nm to 5 μm.

Referring to FIGS. 3A to 5D, the rectangular mold-forming substrate of the invention may be provided on its back surface 3 with a recess (counterbore) 7 or channel 8. In order to mount the substrate in an exposure tool or NIL tool, the recess 7 or channel 8 is formed in accordance with the configuration of the tool or the intended application. The term "recess" refers to a bore which does not penetrate throughout the substrate in its thickness direction, that is, terminates midway with a bottom wall left.

Figure 3A:
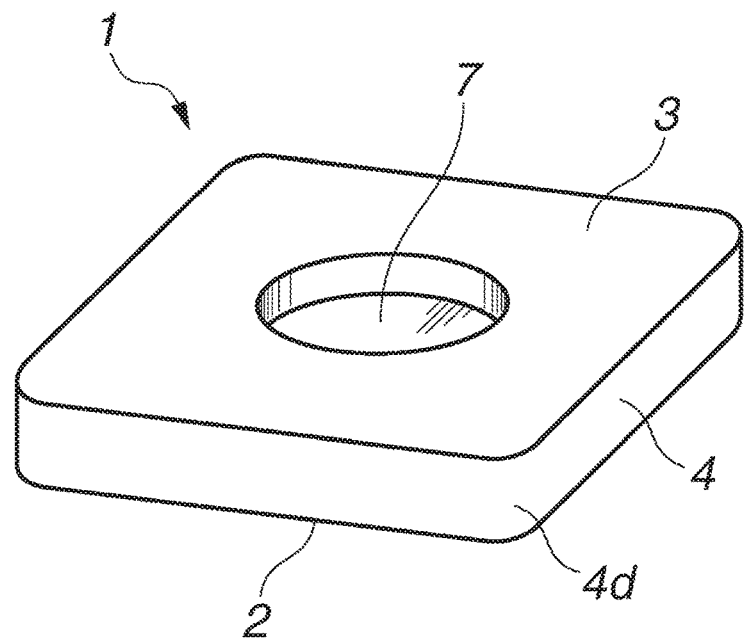
FIGS. 3A-3B are perspective views of a rectangular substrate having a machined back surface in a further embodiment of the invention, FIG. 3A showing the substrate having a recess in its back surface, and FIG. 3B showing the substrate having a channel in its back surface.
Figure 3B:
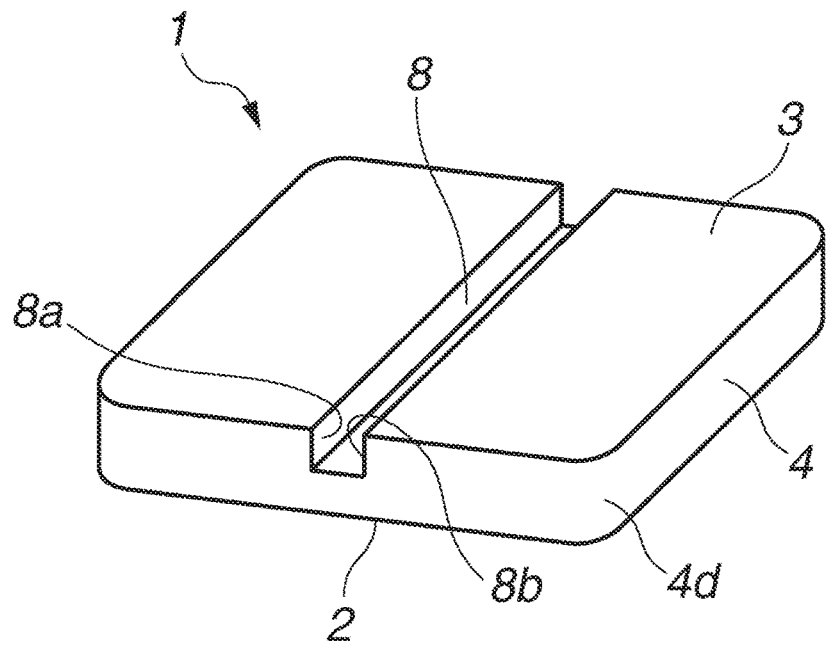
Figure 4A:
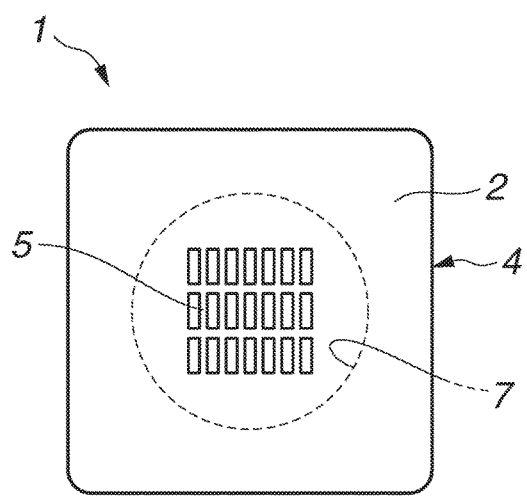
FIGS. 4A-4D illustrate a rectangular substrate having a machined back surface in a still further embodiment of the invention, FIG. 4A being a plan view of the substrate having a recess in the back surface of the substrate of FIG. 1, FIG. 4B being a plan view of the substrate having a recess in the back surface of the substrate of FIG. 2, FIGS. 4C and D being cross-sectional views of FIGS. 4A and B.
Figure 4B:
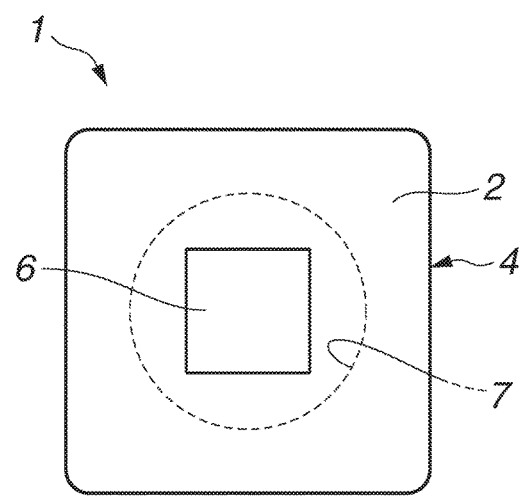

The shape of the recess may be circular, oval, ellipsoidal, rectangular or polygonal in planar shape. The circular shape is preferred as shown in FIGS. 3A, 4A and 4B. The size of the recess is preferably in a range of 5 to 150 mm, in terms of diameter for circular shape, major diameter for oval or ellipsoidal shape, or diagonal length for rectangular shape. As to the channel, it is preferred that side walls 8a, 8b of channel 8 define parallel planes as shown in FIGS. 3B and 5A-5D. However, the side walls of a channel need not be parallel; and one or both of the side walls of a channel may define a curved surface.

Now the method for preparing a rectangular substrate is described. The method includes the steps of providing a starting rectangular substrate having front and back surfaces and four side surfaces which have been ground, and pressing a rotary polishing pad perpendicularly against a longitudinal central region of one side surface under a constant pressure and relatively moving the rotary polishing pad and the substrate parallel to the side surface, for thereby polishing the longitudinal central region of the side surface of the substrate.

The rotary polishing pad used herein is not particularly limited as long as a working portion is a rotating body capable of polishing. A suitable tool includes a shaft, a disc support mounted on the shaft, and a polishing pad attached to the disc support as a working portion. The working portion of the rotary polishing pad may be made of any material selected from expanded polyurethane, ceria-loaded polyurethane, zirconia-loaded polyurethane, non-woven fabric, suede, rubber, and wool felt, for example, as long as it can remove material from a workpiece.

The step of pressing a rotary polishing pad perpendicularly against one side surface of the substrate under a constant pressure may use a press mechanism such as a pneumatic piston, load cell or the like. The polishing pressure under which the side surface, corner and chamfer are polished is preferably in a range of 1 Pa to 1,000,000 Pa (1 MPa), more preferably 1,000 Pa to 100,000 Pa (0.1 MPa).

Figure 6A:
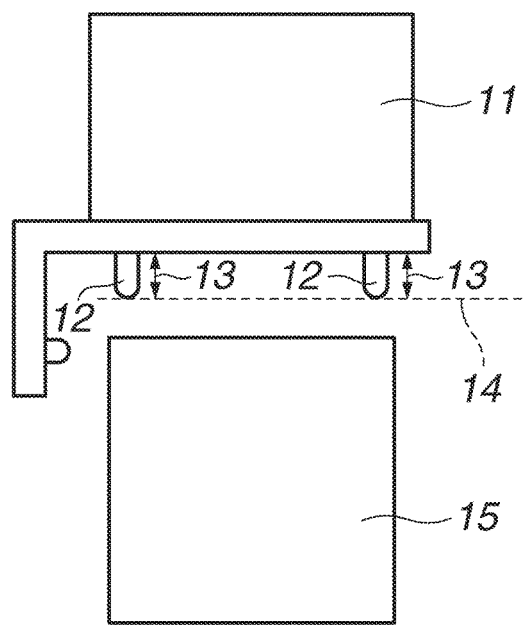
FIGS. 6A-6B illustrate one exemplary method of holding a rectangular substrate using a positioning jig, FIG. 6A showing positional relationship of a straight line connecting the points of positioning pins to a substrate holder, and FIG. 6B showing the rectangular substrate set on the holder.
Figure 6B:
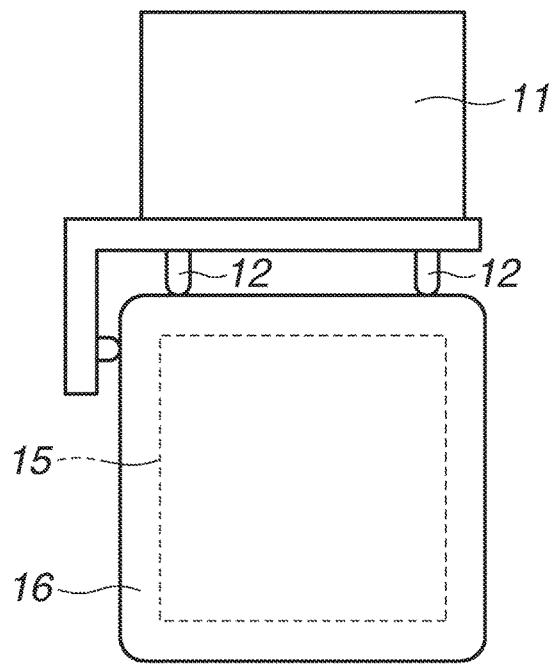

The step of relatively moving the rotary polishing pad and the substrate parallel to the side surface includes setting the substrate on a holder such that the substrate side surface may be parallel to an axis of movement and securing the substrate in place. The axis of movement is an axis of movement along which the rotary polishing pad is linearly moved or an axis of movement of the holder. Specifically, the step uses a positioning jig as shown in FIGS. 6A-6B. The positioning jig 11 includes positioning pins 12 whose protruding distance 13 is adjustable by a bolt or micrometer mechanism. Using the adjusting mechanism in combination with a micro-pickup or the like, the protruding distance 13 of positioning pins 12 is adjusted such that a straight line 14 connecting the points of positioning pins 12 may extend parallel to the axis of movement. A rectangular substrate 16 is set on a holder 15 while the side surface is abutted against positioning pins 12 of jig 11, and then secured to the holder 15 in place. The means of securing the substrate to the holder may be vacuum suction, mechanical clamp, permanent magnet chucking, or electromagnetic chucking. Alternatively, the substrate may be bonded to a securing framework with wax, adhesive, UV-curable resin, sealant or the like, and the framework be secured to the holder by the above-mentioned procedure.

When the substrate is polished by the rotary polishing pad, preferably a polishing compound or slurry may be fed therebetween to promote polishing. The polishing compound is preferably a water slurry containing abrasive grains of silica, ceria, alundum, white alundum (WA), FO (alumina), zirconia, SiC, diamond, titania, or germania, for example, typically having a grain size of 10 nm to 10 μm.

The rotary polishing pad of disc form operates such that the material removal amount is greater in a circumference-adjoining region than in a central region. If all portions of the substrate side surface are polished at a constant pressure and a constant speed, the material removal from the longitudinal edge region of the side surface is greater than from the longitudinal central region, with a possibility that the side surface takes a convex ridge contour. Then, in a preferred embodiment of the invention, the moving speed of the relative parallel movement of the rotary polishing pad and the substrate is changed in accordance with a position on the substrate side surface being polished. In a more preferred embodiment, the moving speed during the relative parallel movement of the rotary polishing pad and the substrate is faster when the center of the rotary polishing pad is positioned at the longitudinal edge region of the substrate side surface than when the center of the rotary polishing pad is positioned at the longitudinal central region of the substrate side surface. Since the edge region of the side surface is polished at a higher moving speed than the central region of the side surface, the material removal from the edge region of the side surface is less than the material removal from the central region of the side surface. This prevents the edge region from being excessively polished as compared with the central region.

It is noted that the longitudinal central and edge regions of the substrate side surface are defined as follows, provided that the substrate side surface (including central region between two edge regions) has a length of 100. Preferably the edge region is a region extending a distance of up to 25, especially 15 to 25, from one edge (transverse edge) of the side surface, and the central region is a region extending a distance of at least 50, especially 50 to 70, between the edge regions. More preferably the edge region is a region extending a distance of up to 30, especially 10 to 30, from one edge (transverse edge) of the side surface, and the central region is a region extending a distance of at least 40, especially 40 to 80, between the edge regions.

In a preferred embodiment, polishing may be performed while the moving speed during the relative parallel movement of the rotary polishing pad and the substrate is changed in accordance with protrusions and recessions on the substrate side surface. For example, a flatness of the side surface of the substrate is previously measured prior to polishing. Then polishing is performed by controlling the moving speed in accordance with protrusions and recessions on the substrate side surface, for example, such that the moving speed is high at recessions and low at protrusions. In this way, the side surface can be polished to a flat surface.

Figure 7:
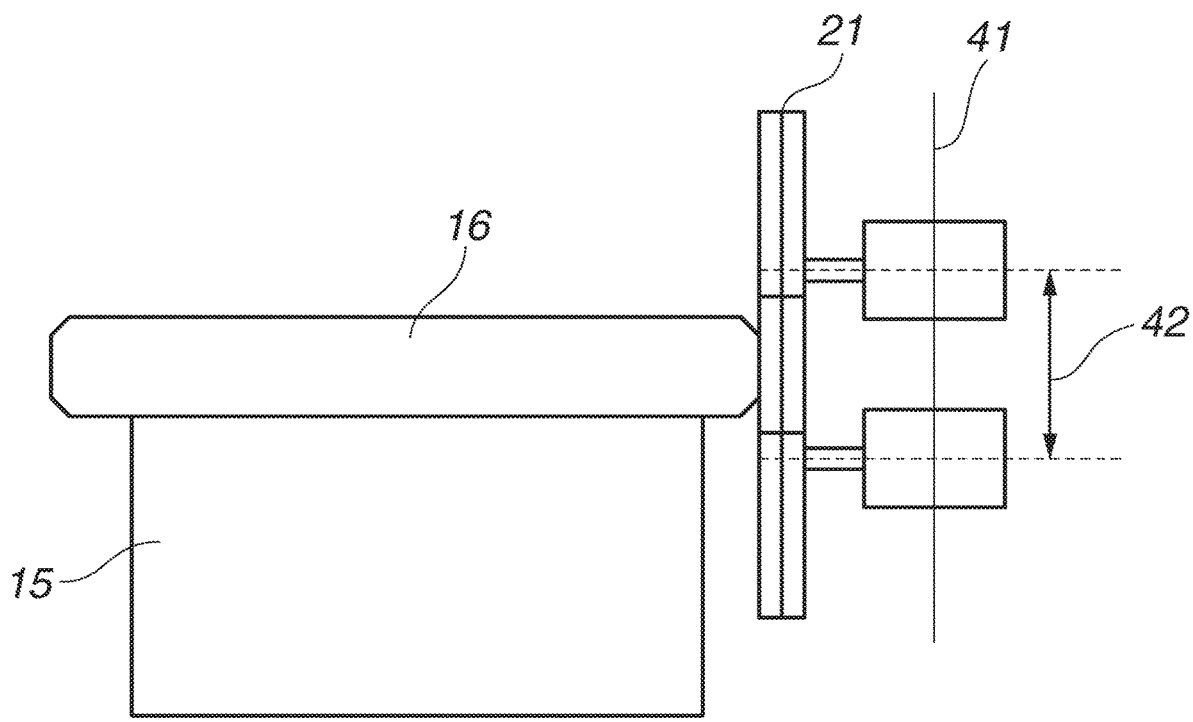
FIG. 7 illustrates one exemplary method of polishing the side surface of the rectangular substrate by moving back and forth the rotary polishing pad in a width direction of the side surface.

In the step of polishing by the rotary polishing pad, the rotary polishing pad and the rectangular substrate may be moved parallel along the axis of movement while the rotary polishing pad and the rectangular substrate are relatively moved in the transverse or width direction of the substrate side surface as shown in FIG. 7, specifically vertically oscillated in FIG. 7. As a consequence, the rotary polishing pad and the rectangular substrate are moved in a zig-zag manner. The vertical oscillation is preferably achieved by moving the rotary polishing pad or the rectangular substrate along a straight line parallel to the transverse or width direction of the substrate side surface. Also the vertical oscillation is preferably limited in a range where the rotary polishing pad is kept in contact with the substrate side surface. Polishing operation performed by the relative parallel movement of the rotary polishing pad and the rectangular substrate and the concurrent vertical oscillation is effective for reducing polishing marks formed on the side surface along the orbit of rotation of the rotary polishing pad. FIG. 7 illustrates an embodiment wherein the rotary polishing pad is vertically oscillated while the position of the rectangular substrate is fixed. The rotary polishing pad 21 is moved up and down, i.e., vertically oscillated along a straight line 41 extending parallel to the transverse or width direction of the side surface of the rectangular substrate 16. FIG. 7 shows the positions of rotary polishing pad 21 reaching the upper and lower ends of an oscillation amplitude 42. Within the oscillation amplitude 42, the rotary polishing pad 21 is kept in contact with the substrate side surface.

In the step of polishing by the rotary polishing pad, after one side surface of the substrate has been polished, the substrate is turned 90°, a next side surface is polished, and these indexing and polishing steps are repeated until all four side surfaces of the substrate are polished. The sequence of indexing and polishing is preferred for polishing accuracy and productivity. The means of turning the substrate by 90° may be a rotating mechanism having a precision positioning function such as a birth coupling or rotary encoder, adapted to turn a holder on which a rectangular substrate is fixedly mounted.

The starting rectangular substrate used herein is a rectangular substrate which has been ground on its side surfaces prior to the step of polishing the rectangular substrate by the rotary polishing pad. The means of grinding the side surfaces of a substrate may be a machining center or NC machine tool, wherein a grinding wheel is rotated and moved under conditions that may not cause damages such as cracks, fissures and chips, thereby grinding the rectangular substrate or workpiece until the side surfaces of predetermined size are obtained. If desired, the curvilinear corners and chamfers may also be formed by grinding as are the side surfaces.

For the grinding purpose, specifically, a grinding wheel having diamond or CBN abrasives electroplated or metal bonded is used and operated at a spindle rotational frequency of 100 to 30,000 rpm, preferably 1,000 to 15,000 rpm and a cutting speed of 1 to 10,000 mm/min, preferably 10 to 1,000 mm/min. Such a grinding wheel and conditions are selected because of working accuracy and productivity.

Preferably the curvilinear corners and chamfers of the rectangular substrate are polished to mirror-like finish for strength retention and cleanness. The corners and chamfers are preferably polished by a method which does not substantially contact the side surfaces or affect the working accuracy of the side surfaces. One suitable method is by feeding a polishing slurry, pressing a rotary polishing pad against the corner or chamfer under a constant pressure, and moving the pad in accordance with the profile of the corner or chamfer. When the corner or chamfer is polished by the rotary polishing pad, a polishing abrasive slurry is preferably introduced. The rotary polishing pad, pressing means, and polishing slurry may be the same as used in the side surface polishing step.

The rectangular substrate has a pattern of protrusions and recessions engraved in its front surface. The means of engraving a pattern of protrusions and recessions may be any means capable of removing material from a predetermined portion of the substrate, for example, laser machining, wet etching, dry etching, photolithography and nanoimprint lithography (NIL). It is described below how to engrave a pattern of protrusions and recessions, but the engraving means is not limited thereto.

Pattern of Protrusions and Recessions of Nano-Order

A rectangular substrate has front and back (or opposed) surfaces and four side surfaces. A thin film of metal is formed over the entire front surface. The film formation means may be, for example, sputtering or evaporation. The metal thin film may be composed of either a single layer or a plurality of layers. One typical example is a thin film of chromium. Next, a resist material for EB lithography is coated on the metal thin film and baked at a suitable temperature for a suitable time to form a resist film.

Using a EB lithography tool, the resist film is exposed to EB in a predetermined pattern and developed. Etching is carried out through the pattern of resist film to remove the predetermined pattern of the metal thin film. The resist film remaining at the end of etching may be removed. The substrate is then etched, thereby engraving a pattern of protrusions and recessions on the substrate. When a pattern of protrusions and recessions of nano-order is formed, for example, the final etching is preferably dry etching because of processing accuracy.

Mesa Structure as Mold

A thin film of metal is formed over the entire front surface. The film formation means may be the same as above. On the substrate front surface, a topographic pattern, typically a pattern of protrusions and recessions of nano-order may have been engraved by the above method. Next, a photoresist material, for example, is coated on the metal thin film and baked at a suitable temperature for a suitable time to form a resist film.

Using an exposure tool, for example, a resist pattern for mesa structure is formed on the resist film by lithography. Specifically, with a photomask bearing a mesa pattern set in the exposure tool, the resist-coated substrate is mounted in the tool, exposed to UV, and developed. Then by wet etching or other suitable means, the chromium thin film is removed except the portion thereof protected with the mesa-forming resist pattern. The substrate is then etched to form a mesa structure. The final etching means may be either wet or dry etching as long as the substrate can be etched. Notably, a structure of millimeter to micrometer order such as an alignment mark can be formed on the substrate by a similar method.

The rectangular substrate may be provided in the back surface with a recess or channel. In the step of grinding a substrate to form a recess or channel therein, a machining center or NC machine tool may be used. A grinding wheel is rotated and moved on a substrate surface to be worked under conditions that may not cause any crack, flaw or chips whereby a recess or channel of predetermined size and depth is formed.

Specifically, a grinding wheel having diamond or CBN abrasives electroplated or metal bonded is used and operated at a spindle rotational frequency of 100 to 30,000 rpm, preferably 1,000 to 15,000 rpm and a cutting speed of 1 to 10,000 mm/min, preferably 10 to 1,000 mm/min.

If desired, the bottom and side walls of the recess or channel as ground are polished. This polishing is effective for removing the work damaged layer on the ground surface to remove residual stresses of grinding, for thereby suppressing any topographic change of the substrate caused by residual stresses. If the bottom and side walls of the recess or channel are not polished, it is difficult to remove stains completely by washing; and if some stains are left, then the pattern may be contaminated therewith. Further, polishing of the bottom and side walls of the recess or channel is also effective for increasing the strength of the bottom and side walls.

The step of polishing the bottom and side walls of the recess or channel is carried out by contacting a working portion of a rotary polishing tool with the bottom and side walls under independent constant pressures and relatively moving the tool at a predetermined speed.

The rotary polishing tool may be of any type as long as its working portion is an abrasive rotary component. Examples include a spindle having a tool chucking portion or a precision grinder having a polishing tool mounted thereon (e.g., Leutor).

The type of material used in the polishing tool is not particularly limited as long as the working portion is a GC wheel, WA wheel, diamond wheel, cerium wheel, cerium pad, rubber wheel, felt buff, polyurethane or other component capable of working and removing workpiece material.

When the recess or channel is polished by the rotary polishing tool with its working portion in contact with the ground surfaces (bottom and side walls), a polishing abrasive slurry is preferably delivered to the polishing site. Examples of suitable abrasive grains used herein include silica, ceria, Alundum, white Alundum (WA), FO, zirconia, SiC, diamond, titania, and Germania, preferably having a grain size in a range of 10 nm to 10 μm. A water slurry of such abrasives may be used.

From the aspect of light transmission, the bottom and side walls of the recess or channel may are preferably polished to a mirror finish as demonstrated by a surface roughness Ra of up to 2 nm, more preferably up to 1 nm. It is noted that the surface roughness Ra is determined according to JIS B-0601.

The step of forming a recess or channel may be conducted before or after the step of grinding the side surfaces, or after the step of polishing the ground side surfaces. Because of ease of working and efficiency, the step of forming a recess or channel by grinding is preferably conducted immediately before or immediately after the step of grinding the side surfaces; and the step of polishing the ground recess or channel is preferably conducted immediately before or immediately after the step of polishing the ground side surfaces.

EXAMPLE

Examples of the invention are given below by way of illustration and not by way of limitation.

Example 1

A rectangular substrate of 160.0 mm squares and 6.50 mm thick was prepared by shaping a synthetic quartz glass ingot into a columnar block and slicing the block.

The substrate was set in a grinding wheel machine. A diamond abrasive grinding wheel was operated to grind the side surfaces and chamfers of the substrate. There was obtained a rectangular substrate of 152.0 mm squares having curvilinear corners and chamfers with a radius of curvature (R) of 2.5 mm.

The opposed (front and back) surfaces of the substrate were then lapped. There was obtained a rectangular synthetic quartz glass substrate whose front and back surfaces were of frosted-glass finish as demonstrated by a surface roughness (RMS) of 0.32 μm.

Figure 8A:
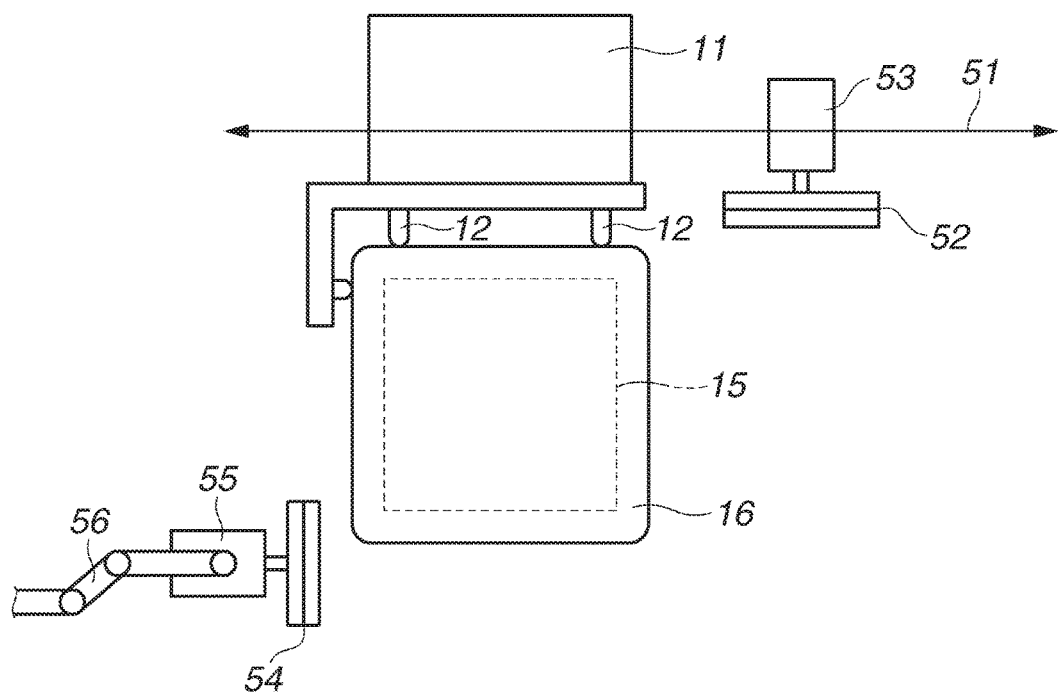
FIGS. 8A-8B is a schematic view of one exemplary side surface mirror-finishing tool, FIG. 8A showing the rectangular substrate set in place, and FIG. 8B showing the step of polishing the substrate.

The substrate was introduced into a side surface mirror-finishing tool as outlined in FIG. 8A. The substrate 16 was set on a holder 15 of the tool by a vacuum chuck, while the side surface was abutted against positioning pins 12 of a positioning jig 11, such that the side surface was parallel to an axis of movement 51 of a rotary polishing pad 52. The vacuum chuck was actuated to fixedly secure the substrate to the holder 15. Thereafter the positioning jig 11 is moved to a position not interfering with the polishing operation, that is, retracted in the tool.

Figure 8B:
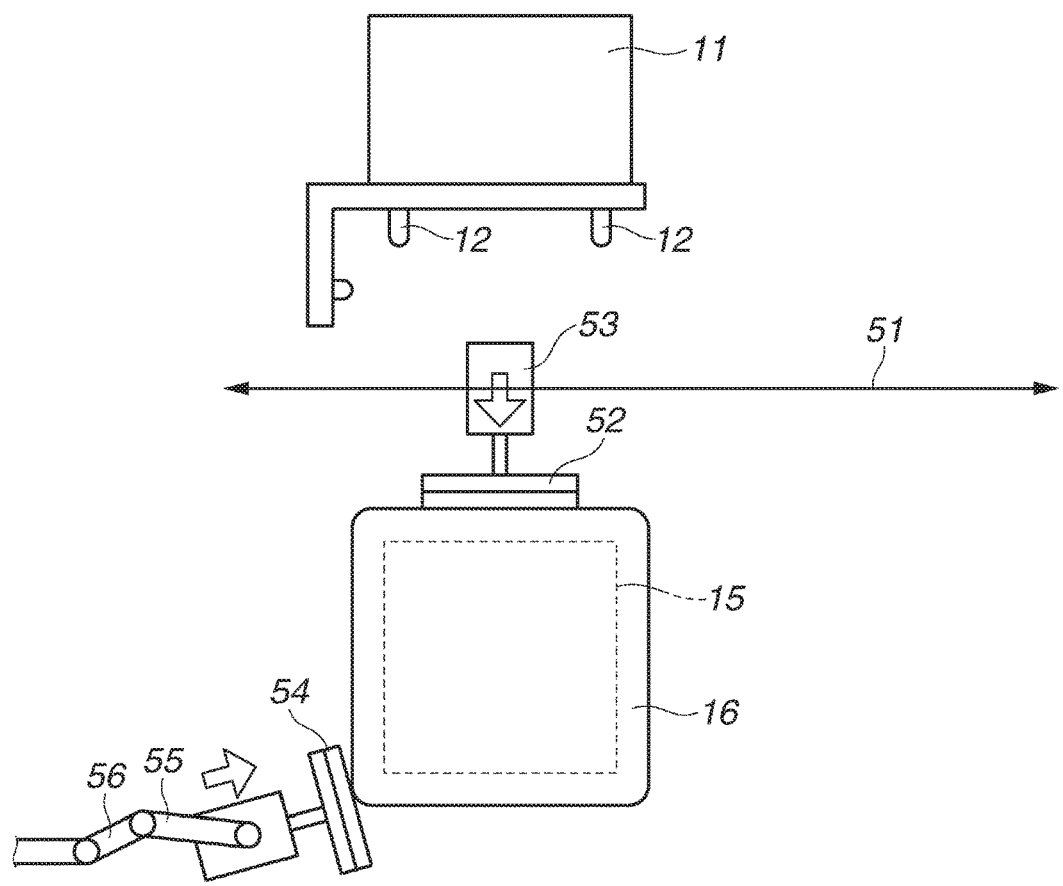

Thereafter, the curvilinear corners, chamfers and side surfaces of the glass substrate were polished. The operation of the side surface mirror-finishing tool is outlined in FIG. 8B.

The curvilinear corner or chamfer of the substrate was polished by feeding a polishing slurry, pressing a rotary polishing pad 54 against the surface under a constant pressure of 0.02 MPa, and moving the pad along the contour of the corner or chamfer. A robot used herein included a 5-axis multi-joint arm 56, a pneumatic piston pressing mechanism 55 at the distal end of the arm, and the rotary polishing pad 54 coupled to the mechanism 55. An aqueous solution of cerium oxide was used as the polishing slurry; and an abrasive polyurethane cloth was used as the polishing portion of the rotary polishing pad 54.

The side surface of the substrate was polished by feeding a polishing slurry, pressing a rotary polishing pad 52 perpendicularly against the surface under a constant pressure of 0.04 MPa by a pneumatic piston pressing mechanism 53, and moving the pad 52 back and forth longitudinally and parallel to the side surface, and concurrently oscillating the pad in the transverse or width direction. Polishing was performed while controlling such that the moving speed of the polishing pad 52 when the center of the pad 52 reached the longitudinally edge region of the side surface during the step of moving the pad 52 back and forth, might be faster than the moving speed when the pad was in the longitudinally central region of the side surface. An aqueous solution of cerium oxide was used as the polishing slurry; and an abrasive non-woven cloth was used as the polishing portion of the rotary polishing pad 52.

Polishing of the corners, chamfers and side surfaces was carried out in sequence by rotatably indexing the substrate at an angle of 90° by a revolving mechanism having a precision positioning function such as a birth coupling. The polishing operation was carried out in a sequence of chamfer of corner, corner, chamfer of side surface, and side surface.

After polishing of all the corners, chamfers and side surfaces was completed, the substrate was taken out of the vacuum chuck of the tool. At this point, the substrate was of 151.980 mm squares.

Next, the front and back surfaces of the quartz glass substrate were roughly polished with cerium oxide and precision polished with colloidal silica, obtaining a quart glass substrate whose front and back surfaces were mirror-finished to be fully flat and substantially defect-free. The substrate had a thickness of 6.35 mm.

In a sputtering chamber, a chromium thin film was deposited on the entire front surface of the substrate. Then a resist for EB lithography (ZEP720A by Nippon Zeon Co., Ltd.) was coated onto the chromium thin film by a spin coater, and prebaked under the predetermined conditions of temperature and time to form a resist film.

Using an EB imaging tool, the resist film was imaged with a line-and-space pattern. This was followed by development of the resist film, dry etching with chlorine gas to remove the chromium thin film, and dry etching with $CHF_3$ gas, forming a pattern of protrusions and recessions on the glass substrate. There was obtained a rectangular substrate of synthetic quartz glass for imprint lithography whose front surface was engraved with a line-and-space pattern of protrusions and recessions at a half pitch of 20 nm, as shown in FIGS. 1A-1D.

The substrate was measured for flatness, corner angle, and surface roughness, with the results shown below.
Flatness of Side Surface
  Measurement Results on Four Side Surfaces
  3.5 μm, 3.5 μm, 2.9 μm, 3.5 μm
Angle Between Adjoining Side Surfaces
  within 90°±0.04° for all four corners
Surface Roughness of Side Surface
  Ra=0.15 nm Notably, the flatness of side surface was measured by Zygo NewView 7300 (Zygo), the angle by a dial gauge, and Ra by an atomic force microscope.

Example 2

A rectangular substrate of synthetic quartz glass dimensioned 153.0 mm squares and 6.35 mm thick was prepared as the starting substrate. The substrate had two opposed (front and back) surfaces which were precision polished and side surfaces, curvilinear corners and chamfers which were mirror finished by brush polishing.

In a sputtering chamber, a chromium thin film was deposited on the entire front surface of the substrate. Then a positive photoresist (AZP1350 by AZ Electronic Materials Co., Ltd.) was coated onto the chromium thin film by a spin coater, and prebaked under the predetermined conditions of temperature and time to form a resist film.

The resist-bearing substrate was introduced into an exposure tool where it was exposed to UV radiation through a photomask. The photomask used herein was a glass photomask having a rectangular mesa pattern of 26 mm×33 mm at the center.

The resist-bearing substrate was taken out of the exposure tool and developed to form a mesa-forming resist pattern. On the substrate, chromium etching in an aqueous solution of ammonium cerium(IV) nitrate was carried out to remove the chromium thin film except the portion thereof protected with the mesa-forming resist pattern. Then wet etching in an aqueous solution of hydrofluoric acid was carried out to remove the quartz glass except the portion thereof protected with the resist pattern. The resist film was stripped with acetone, obtaining a mesa structure having a height of about 30 µm having chromium thin film deposited on its surface.

The quartz glass substrate, with its front surface faced upward, was bonded onto a platform of stainless steel with Shiftwax®. The platform having the substrate bonded thereto was introduced into a machining center, and secured to a work table of the machining center by a magnetic chuck. Then the side surfaces and chamfers were ground by a diamond abrasive grinding wheel, obtaining a rectangular substrate of 152.0 mm squares having curvilinear corners and chamfers with R=2.5 mm. Thereafter, the platform having the substrate bonded thereto was taken out.

The platform having the substrate bonded thereto was introduced into a side surface mirror-finishing tool as outlined in FIG. 8A. The substrate was set on a holder 15 of the tool by a magnetic chuck, while the side surface was abutted against positioning pins 12 of a positioning jig 11, such that the side surface was parallel to an axis of movement 51 of a rotary polishing pad 52. The magnetic chuck was actuated to fixedly secure the substrate to the holder 15. Thereafter, the corners, chamfers and side surfaces of the glass substrate were polished as in Example 1.

Figure 2A:
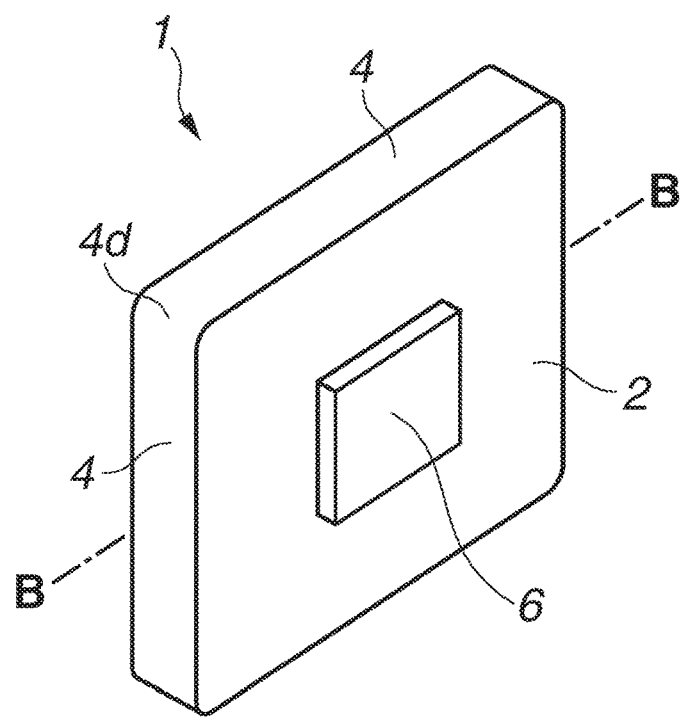
FIGS. 2A-2B illustrate a rectangular substrate in another embodiment of the invention, FIG. 2A being a perspective view, and FIG. 2B being a cross-sectional view taken along lines B-B in FIG. 2A.
Figure 2B:
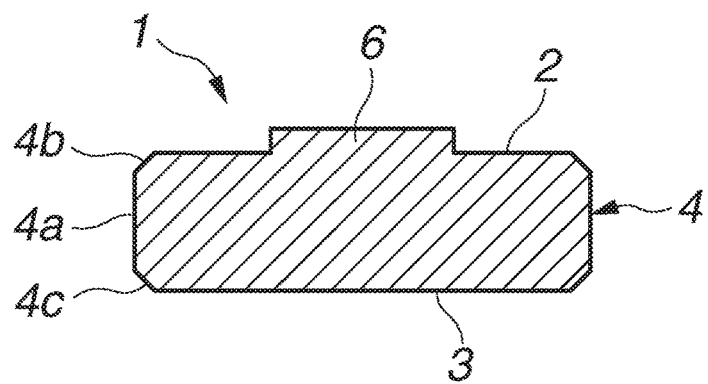

After polishing of all the corners, chamfers and side surfaces was completed, the platform having the substrate bonded thereto was taken out of the magnetic chuck of the tool. Shiftwax was melted by heating, and the substrate was removed from the platform. After washing, there was obtained a rectangular substrate whose front surface was engraved with a mesa structure of rectangular configuration 26 mm×33 mm and height 30 µm as shown in FIGS. 2A-2B.

The substrate was measured for flatness, corner angle, and surface roughness using the same instruments as in Example 1, with the results shown below.

Flatness of Side Surface
  Measurement Results on Four Side Surfaces
    1.9 µm, 2.5 µm, 1.9 µm, 2.1 µm
Angle Between Adjoining Side Surfaces
  within 90°±0.04° for all four corners
Surface Roughness of Side Surface
  Ra=0.17 nm Example 3

A rectangular substrate of synthetic quartz glass dimensioned 152.0 mm squares and 6.35 mm thick was prepared as the starting substrate. The substrate had two opposed (front and back) surfaces which were precision polished and side surfaces, curvilinear corners and chamfers which were mirror finished by brush polishing.

In a sputtering chamber, a chromium thin film was deposited on the entire front surface of the substrate. Then a resist for EB lithography (ZEP720A by Nippon Zeon Co., Ltd.) was coated onto the chromium thin film by a spin coater, and prebaked under the predetermined conditions of temperature and time to form a resist film.

Using an EB imaging tool, the resist film was imaged with a line-and-space pattern. This was followed by development of the resist film, dry etching with chlorine gas to remove the chromium thin film, and dry etching with $CHF_3$ gas, forming a pattern of protrusions and recessions on the glass substrate.

The substrate was introduced into a dicing tool whereupon the substrate was diced by a diamond abrasive dicing blade into a rectangular plate substrate dimensioned 75.0 mm squares.

The quartz glass substrate, with its front surface faced downward, was bonded onto a platform of stainless steel with Shiftwax®. The platform having the substrate bonded thereto was introduced into a machining center, and secured to a work table of the machining center by a magnetic chuck. Then the side surfaces, chamfers and a recess were ground by a diamond abrasive grinding wheel, obtaining a rectangular substrate dimensioned 70.0 mm squares having curvilinear corners and chamfers with R=1.0 mm and a circular recess with diameter 50 mm and depth 4 mm. Thereafter, the platform having the substrate bonded thereto was taken out.

Thereafter, the corners, chamfers and side surfaces of the glass substrate were polished as in Example 1.

After polishing of all the corners, chamfers and side surfaces was completed, the platform having the substrate bonded thereto was taken out of the magnetic chuck of the tool. Next, the substrate was secured to a holder of a buffing tool. The bottom and side walls of the ground recess were polished to mirror-like finish by feeding a polishing slurry of cerium oxide abrasives, forcing a wool felt buff having a diameter of 50 mm and a height of 30 mm adapted to rotate at 500 rpm against the bottom wall under a pressure of 3,500 Pa and the side wall under a pressure of 2,000 Pa, rotating the holder at 10 rpm, and continuing polishing for 60 minutes.

Figure 4C:
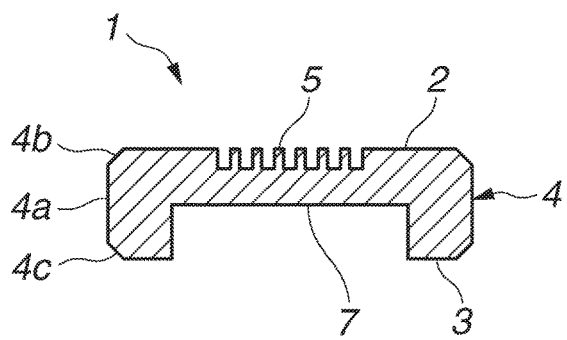
Figure 4D:
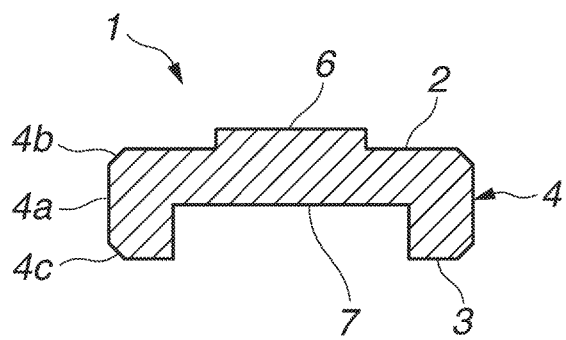

Shiftwax was melted by heating, and the substrate was removed from the platform. After washing, there was obtained a rectangular substrate whose front surface was engraved with a topographic line-and-space pattern having a half pitch of 20 nm as shown in FIGS. 4A and 4C and back surface was provided with the circular recess.

The substrate was measured for flatness, corner angle, and surface roughness using the same instruments as in Example 1, with the results shown below.

Flatness of Side Surface
  Measurement Results on Four Side Surfaces
    1.7 µm, 2.1 µm, 2.3 µm, 1.9 µm
Angle Between Adjoining Side Surfaces
  within 90°±0.04° for all four corners
Surface Roughness of Side Surface
  Ra=0.21 nm Example 4

A rectangular substrate of synthetic quartz glass dimensioned 153.0 mm squares and 6.35 mm thick was prepared as the starting substrate. The substrate had two opposed (front and back) surfaces which were precision polished and side surfaces, curvilinear corners and chamfers which were mirror finished by brush polishing.

In a sputtering chamber, a chromium thin film was deposited on the entire front surface of the substrate. Then a positive photoresist (AZP1350 by AZ Electronic Materials Co., Ltd.) was coated onto the chromium thin film by a spin coater, and prebaked under suitable conditions of temperature and time to form a resist film.

The resist-bearing substrate was introduced into an exposure tool where it was exposed to UV radiation through a photomask. The photomask used herein was a glass photomask having a rectangular mesa pattern of 26 mm×33 mm at the center.

The resist-bearing substrate was taken out of the exposure tool and developed to form a mesa-forming resist pattern. On the substrate, chromium etching in an aqueous solution of ammonium cerium(IV) nitrate was carried out to remove the chromium thin film except the portion thereof protected with the mesa-forming resist pattern. Then wet etching in an aqueous solution of hydrofluoric acid was carried out to remove the quartz glass except the portion thereof protected with the resist pattern. The resist film was stripped with acetone, obtaining a mesa structure having a height of about 30 μm having chromium thin film deposited on its surface.

The quartz glass substrate, with its front surface faced downward, was bonded onto a platform of stainless steel with Shiftwax®. The platform having the substrate bonded thereto was introduced into a machining center, and secured to a work table of the machining center by a magnetic chuck. Then the side surfaces, chamfers and channel were ground by a diamond abrasive grinding wheel, obtaining a rectangular substrate of 152.0 mm squares having curvilinear corners and chamfers with R=2.5 mm and a channel extending parallel to the side surface, the channel having a depth 3 mm, width 30 mm, and length 152 mm. Thereafter, the platform having the substrate bonded thereto was taken out.

Thereafter, the corners, chamfers and side surfaces of the glass substrate were polished as in Example 1.

After polishing of all the corners, chamfers and side surfaces was completed, the platform having the substrate bonded thereto was taken out of the magnetic chuck of the tool. Next, the substrate was secured to a holder of a buffing tool. The bottom and side walls of the ground channel were polished to mirror-like finish by feeding a polishing slurry of cerium oxide abrasives, forcing a wool felt buff having a diameter of 30 mm and a height of 30 mm adapted to rotate at 1,000 rpm against the bottom wall under a pressure of 2,000 Pa and one side wall under a pressure of 2,000 Pa, moving back and forth the holder at 50 mm/min over 5 cycles, forcing the wool felt buff against the bottom wall and the other side wall under the same pressure as above, moving back and forth the holder at 50 mm/min over 5 cycles.

Figure 5A:
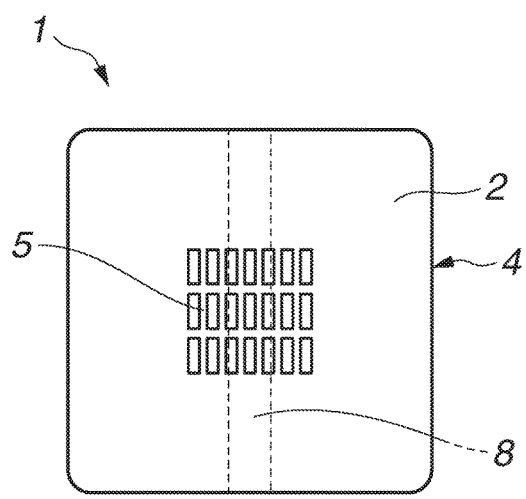
Figure 5B:
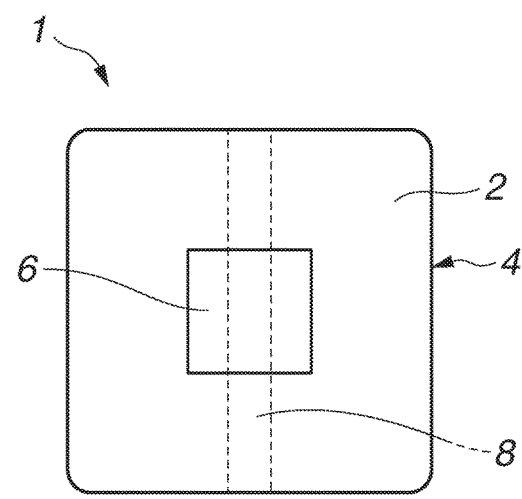
Figure 5C:
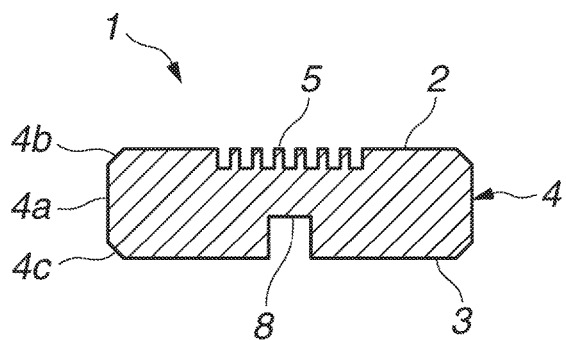
Figure 5D:
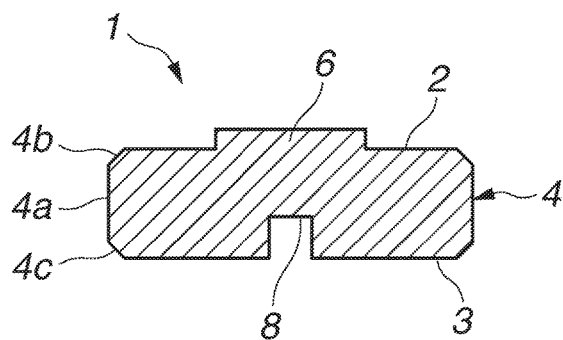

Shiftwax was melted by heating, and the substrate was removed from the platform. After washing, there was obtained a rectangular substrate whose front surface was engraved with a mesa structure of rectangular configuration 26 mm×33 mm and height 30 μm as shown in FIGS. 5B and 5D and back surface was provided with the channel.

The substrate was measured for flatness, corner angle, and surface roughness using the same instruments as in Example 1, with the results shown below.

Flatness of Side Surface
  Measurement Results on Four Side Surfaces
  3.1 μm, 3.1 μm, 2.6 μm, 2.5 μm
Angle Between Adjoining Side Surfaces
  within 90°±0.04° for all four corners
Surface Roughness of Side Surface
  Ra=0.19 nm Japanese Patent Application No. 2014-166352 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A rectangular substrate for use in imprint lithography, the substrate having front and back surfaces and four side surfaces, the front surface being engraved with a pattern of protrusions and recessions, and the side surfaces having a flatness of up to 10 μm.

2. The rectangular substrate of claim 1 wherein the angle included between adjoining side surfaces is in a range of 90±0.1°.

3. The rectangular substrate of claim 1 wherein the side surfaces are mirror finished.

4. The rectangular substrate of claim 3 wherein the side surfaces have a surface roughness Ra of 0.01 to 2 nm.

5. The rectangular substrate of claim 1 wherein the back surface is provided with a recess or channel.

* * * * *